United States Patent [19]

Merrill

[11] Patent Number: 5,773,864
[45] Date of Patent: Jun. 30, 1998

[54] CMOS INTERFACE CIRCUIT FORMED IN SILICON-ON-INSULATOR SUBSTRATE

[75] Inventor: Richard Billings Merrill, Daly City, Calif.

[73] Assignee: National Semiconductor Corporation, Santa Clara, Calif.

[21] Appl. No.: 430,997

[22] Filed: Apr. 28, 1995

[51] Int. Cl.$^6$ .................................................. H01L 27/01
[52] U.S. Cl. ....................... 257/347; 257/350; 257/351; 437/40
[58] Field of Search .................................. 257/347, 350, 257/351; 437/40

[56] References Cited

U.S. PATENT DOCUMENTS

| | | | |
|---|---|---|---|
| 4,253,162 | 2/1981 | Hollingsworth | 365/175 |
| 4,725,875 | 2/1988 | Hsueh | 257/351 |
| 4,918,498 | 4/1990 | Plus et al. | 357/23.7 |
| 5,412,240 | 5/1995 | Inoue et al. | 257/351 |

FOREIGN PATENT DOCUMENTS

0304811  3/1989  European Pat. Off. .

*Primary Examiner*—Mark V. Prenty
*Attorney, Agent, or Firm*—Skjerven, Morrill, MacPherson, Franklin & Friel; David E. Steuber

[57] ABSTRACT

A CMOS circuit formed in a silicon-on-insulator (SOI) substrate includes MOSFETs having drain and body diffusions which extend through the silicon layer to the surface of the insulating layer. Each of drains of the N-channel and P-channel MOSFETs serves also as a terminal (anode or cathode) of a diode that is connected in series with the MOSFET. This structure allows the CMOS device to be fabricated as a completely symmetrical structure without adding processing steps beyond those customary in fabricating conventional CMOS devices.

7 Claims, 9 Drawing Sheets

CMOS INTERFACE CIRCUIT FORMED IN SILICON-ON-INSULATOR SUBSTRATE

FIELD OF THE INVENTION

This invention relates to interface circuits and, in particular, to an interface circuit formed in a silicon-on-insulator substrate that is capable of converting a high-voltage signal to a low-voltage signal.

BACKGROUND OF THE INVENTION

Silicon-on-insulator (SOI) substrates are generally fabricated by forming a $SiO_2$ layer on the surface of a silicon "bond wafer" and bonding the bond wafer to a base wafer to form an $Si-SiO_2-Si$ sandwich. The bond wafer is then ground and polished until a layer of silicon of a desired thickness is formed. The resulting structure is a sandwich consisting of a relatively thick silicon layer (sometimes referred to as the "handle wafer") which is overlain by relatively thin layers of $SiO_2$ and silicon. Semiconductor devices are typically formed in the top silicon layer.

Until now, SOI substrates have not found wide acceptance, and most integrated circuits have been formed in a silicon substrate or in an epitaxial layer formed on the surface of a silicon substrate. CMOS circuits, for example, are normally fabricated by first creating a well that is doped to a conductivity type that is opposite to the conductivity type of the silicon substrate. A P-well is formed, for example, in an N-type substrate, with the NMOS device being formed in the P-well and the PMOS device being formed in the N-type substrate. The CMOS device is normally isolated from other devices in the substrate by, for example, surrounding the CMOS device with a field oxide region.

This structure presents several problems. First, since one of the MOSFETs is formed in a well while the other is formed in the substrate, the CMOS device as a whole cannot be symmetrical. Second, forming a diode in the well creates a parasitic bipolar transistor, with the substrate acting as the collector. Therefore, practically all of the current through the diode will be diverted into the substrate. Third, forming the field oxide requires additional processing steps.

These drawbacks are overcome in the CMOS interface circuit of this invention.

SUMMARY OF THE INVENTION

The circuit of this invention includes a CMOS device that is formed in an SOI substrate. The N-channel MOSFET includes a body diffusion of P-type material which extends to the insulating layer of the SOI substrate. The N-type source of the NMOSFET is formed within the body diffusion, and the N-type drain is formed as a separate diffusion adjacent the body diffusion. The source and drain are separated by a channel region near the surface of the substrate, and a gate is formed over the channel region. The drain of the NMOSFET also serves as the cathode of a diode which has as its anode an adjacent P-type diffusion.

Conversely, The P-channel MOSFET includes a body diffusion of N-type material which likewise extends to the insulating layer of the SOI substrate. The P-type source of the NMOSFET is formed within the body diffusion, and the P-type drain is formed as a separate diffusion adjacent the body diffusion. The source and drain are separated by a channel region near the surface of the substrate, and a gate is formed over the channel region. The drain of the PMOSFET also serves as the anode of a diode which has as its cathode an adjacent N-type diffusion.

The diffusions are electrically isolated from each other because (except for the sources, which are surrounded by the body diffusions) each diffusion extends to the insulating layer.

This structure may advantageously be used to create an interface circuit which draws no current and which is capable of converting a high-voltage signal to a low-voltage signal. The input terminal, which receives the high-voltage signal, is connected in common to the anode of the diode that is associated with the NMOSFET and the cathode of the diode that is associated with the PMOSFET. The MOSFETs are used as pass transistors which provide intermediate outputs at their respective source terminals. These intermediate outputs may be directed to a Schmitt trigger if a binary output is desired.

The interface circuit is symmetrical and may be fabricated with no processing steps beyond those ordinarily used in making a CMOS device. The need for special isolating structures such as field oxide regions is eliminated.

DESCRIPTION OF THE INVENTION

Figure 1:
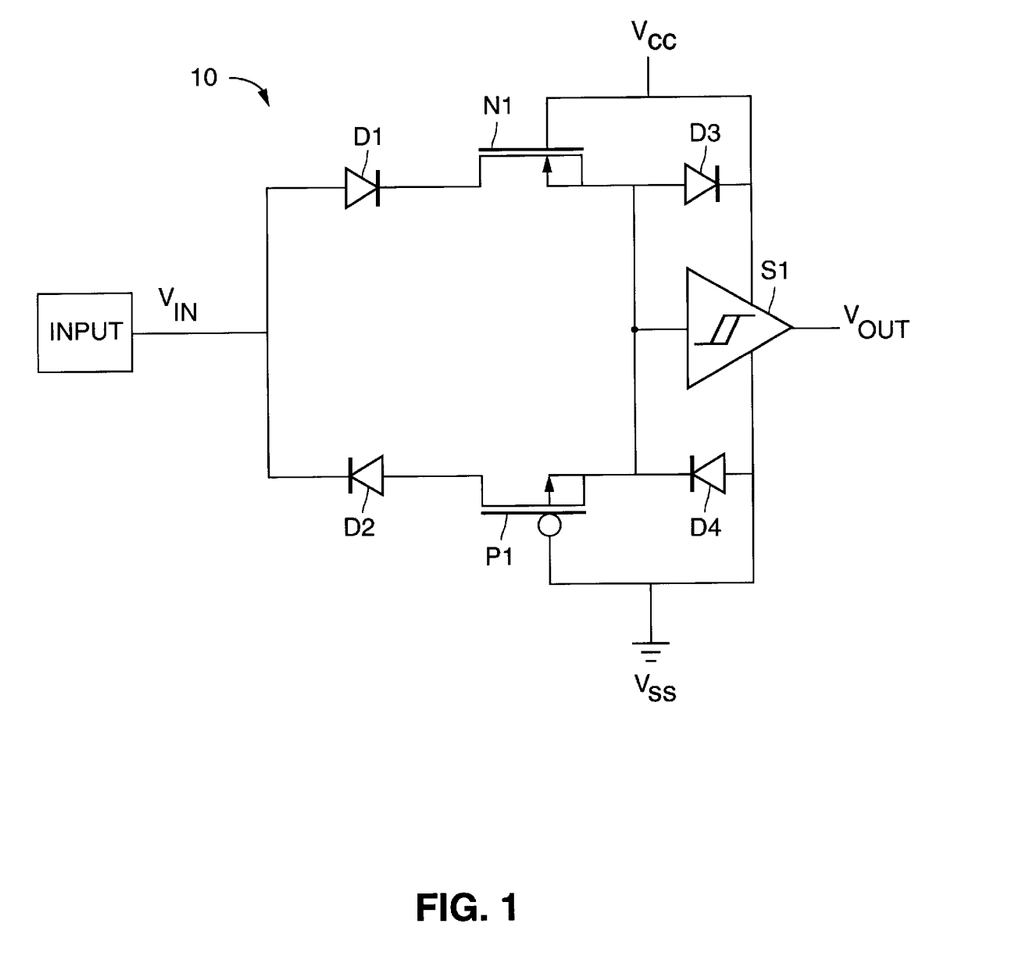
FIG. 1 illustrates a circuit diagram of a zero currents high voltage interface circuit in accordance with the invention.

FIG. 1 illustrates a circuit diagram of a CMOS interface circuit 10 formed on a silicon-on-insulator substrate which is capable of transforming a high voltage input signal to a low voltage output signal while drawing essentially no input current.

A high-voltage input signal $V_{IN}$ is delivered to the anode of a diode Di and the cathode of a diode D2. Diode D1 is connected in a series path with an N-channel MOSFET N1 and a diode D3, the gate of MOSFET N1 being connected to a positive supply voltage $V_{SS}$. Diode D2 is connected in a second series path with a P-channel MOSFET P1 and a diode D4, the gate of MOSFET P1 being connected to a negative supply voltage $V_{SS}$ (in this case ground). The source terminals of MOSFETS N1 and P1 are connected to the inputs of a Schmitt trigger S1, which delivers a low-voltage output signal $V_{OUT}$.

For purposes of explanation, it is assumed that $V_{IN}$ oscillates between +30 V and −30 V. When $V_{IN}$ goes high, diode D2 is reverse-biased, blocking the signal from MOSFET P1. Diode D1 is forward-biased and delivers a voltage 30 V−$V_{be}$≈29 V to the drain of MOSFET N1. MOSFET N1 acts as a pass transistor. Assuming that $V_{CC}$=3.3 V, the source of MOSFET N1 will charge up to a level $V_{GS}-V_{TN}$, or about 2.6 V, and will draw essentially no current. Schmitt trigger S1 may, for example, be designed to deliver a $V_{OUT}$ of 3.3 V when its input is high. Diode D3 protects the input of Schmitt trigger S1 from an overvoltage condition. The voltage at the input of Schmitt trigger S1 is clamped to $V_{CC}+V_{be}$.

When $V_{IN}$ goes low, diode D1 is reverse-biased and diode D2 delivers a voltage −30 V+$V_{be}$≈−29 V to the drain of MOSFET P1, which also acts as a pass transistor. The source of MOSFET P1 charges to a voltage $V_{TP}$≈0.7 V, drawing essentially no current, and $V_{TP}$ is therefore delivered to the input of Schmitt trigger S1. In this situation Schmitt trigger S1 might deliver a $V_{OUT}$ of 0 V, for example. Diode D4 protects the input of Schmitt trigger against an undervoltage condition by clamping it to $-V_{be}$.

Schmitt trigger S1 is of conventional CMOS design.

Figure 2:
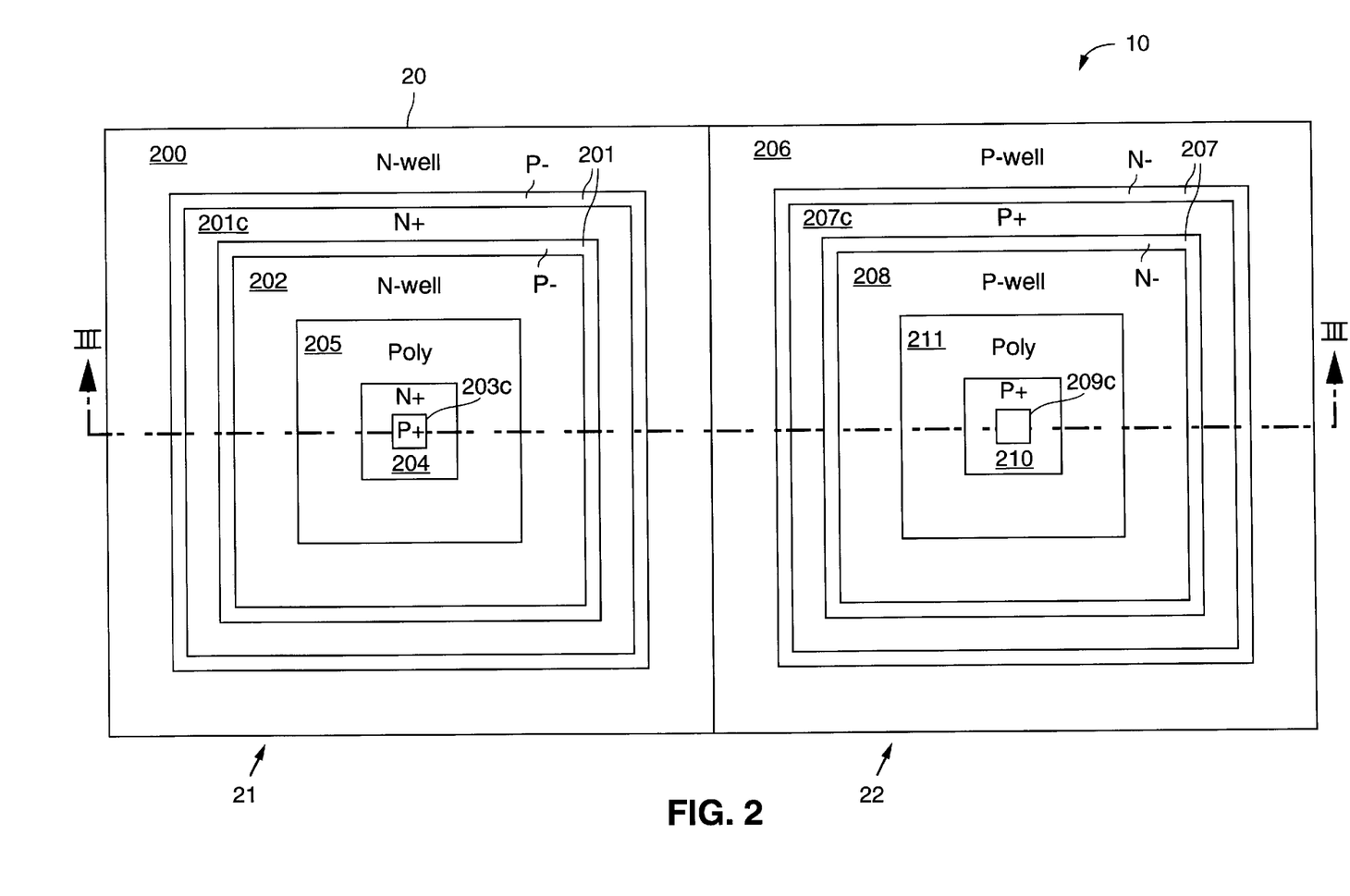
FIG. 2 illustrates a plan view of an integrated embodiment of the circuit shown in FIG. 1.

In accordance with this invention, interface circuit 10 is fabricated in integrated form on a silicon-on-insulator (SOI) substrate. FIG. 2 shows a plan view of a SOI substrate 20, and FIG. 3 shows a cross-sectional view of the substrate taken at section III-III of FIG. 2.

Figure 3:
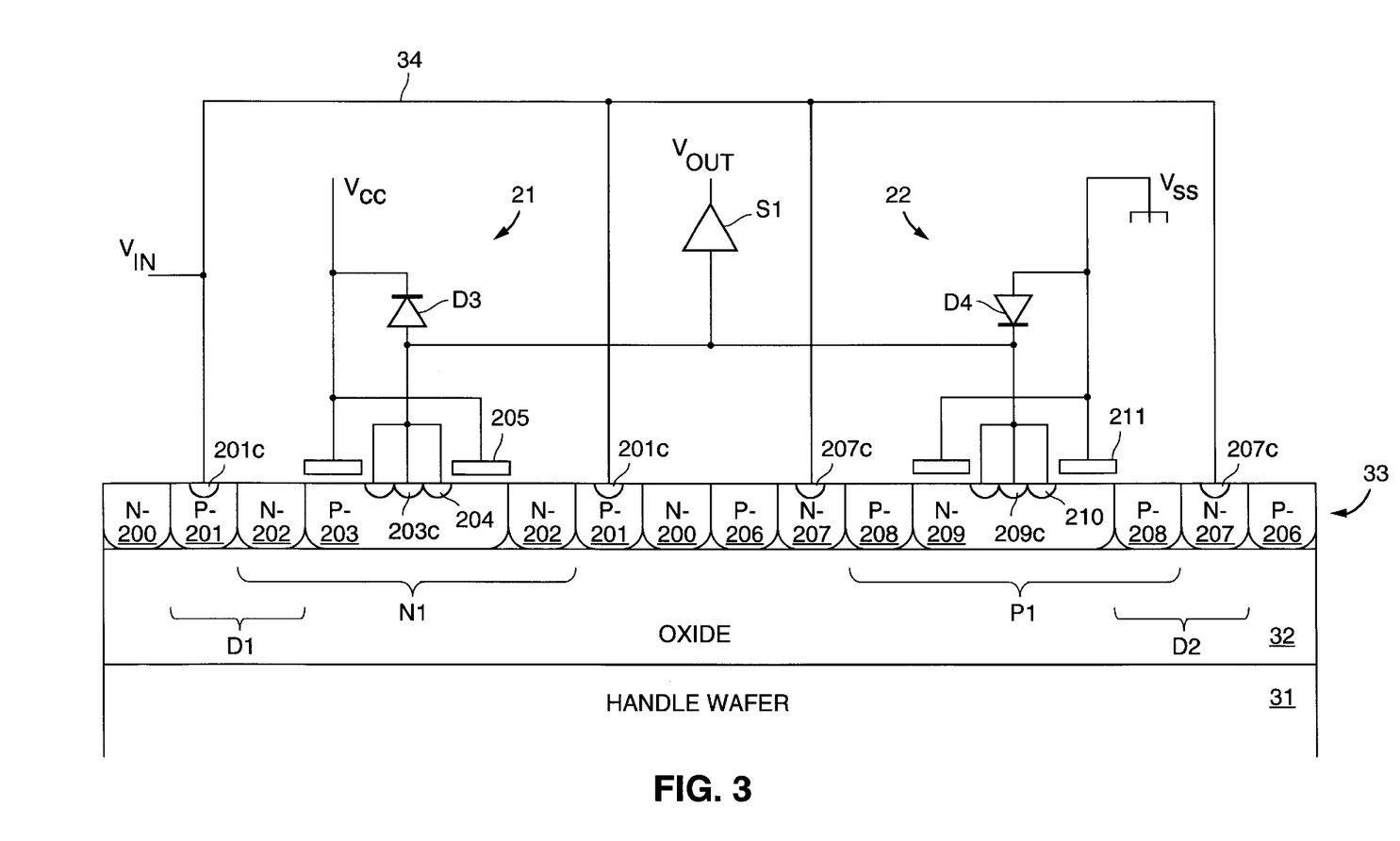
FIG. 3 illustrates a cross-sectional view of the integrated embodiment shown in FIG. 2 taken at section III—III.

Referring initially to FIG. 3, substrate 20 contains a handle wafer 31, a silicon dioxide layer 32 and a silicon layer 33. Silicon layer 33 has a thickness which is preferably in the range 1–2 $\mu$m. SOI substrates suitable for use with this invention are available, for example, from Shin-Etsu Handotai Co., Ltd., 1-4-2 Marunouchi, Chiyoda-ku, Tokyo, 100, Japan.

FIG. 2 illustrates that circuit 10 is formed of two large wells 21 and 22 that are formed in substrate 20. As described below, diode D1 and MOSFET N1 are formed in well 21, and diode D2 and MOSFET P1 are formed in well 22.

As is evident from FIG. 2, wells 21 and 22 each contain a series of annular diffusions or wells which are shown in cross-section in FIG. 3. Starting at the periphery of well 21, a lightly doped N− well 200 serves to isolate well 21 laterally from other devices formed in substrate 20. Inside of N− well 200 are a P-well 201 and an N− well 202 which form the anode and cathode, respectively, of diode D1. A P+ contact diffusion 201C (not shown in FIG. 2) is formed in P-well 201 and provides a contact for a line 34 which carries $V_{IN}$. N− well 202 also serves as the drain of MOSFET N1. A central P− well 203 forms the body of MOSFET N1 and includes a P+ contact diffusion 203C. A relatively shallow N+ well 204 surrounds contact diffusion 203C and serves as the source of MOSFET N1. A polysilicon gate 205 is formed above the surface of silicon layer 33 and is separated by a gate oxide layer from a channel region of P− well 203. Owing to the presence of gate 205, P− well 203 is not visible in the plan view of FIG. 2.

The gate oxide layer and other features above the surface of silicon layer 33, such as metal and passivation layers, are not shown in FIG. 3 in the interests of clarity. These structures are formed by techniques well known in the art.

Starting at the periphery of well 22, a lightly doped P− well 206 serves to isolate well 22 laterally from other devices formed in substrate 20. Inside of P− well 206 are a N− well 207 and an P− well 208 which form the cathode and anode, respectively, of diode D2. An N+ contact diffusion 207C (not shown in FIG. 2) is formed in N− well 207 and provides a contact for line 34.

P− well 208 also serves as the drain of MOSFET P1. A central N− well 209 forms the body of MOSFET P1 and includes an N+ contact diffusion 209C. A relatively shallow P+ well 210 surrounds contact diffusion 209C and serves as the source of MOSFET P1. A polysilicon gate 211 is formed above the surface of silicon layer 33 and is separated by a gate oxide layer from a channel region of N− well 209. Owing to the presence of gate 211, N− well 209 is not visible in the plan view of FIG. 2.

Line 34, which carries $V_{IN}$, is connected to P− well 201 (the anode of diode D1) via contact diffusion 201C and to N− well 207 (the cathode of diode D2) via contact diffusion 207C. $V_{CC}$ is connected to gate 205, and $V_{SS}$ (ground) is connected to gate 211. P+ diffusion 203C and N+ well 204 (the body contact and source, respectively, of MOSFET N1) are shorted together and are connected to the anode of diode D3 and the input of Schmitt trigger S1. N+ diffusion 209C and P+ well 210 (the body contact and source, respectively, of MOSFET P1) are shorted together and are connected to the cathode of diode D4 and the input of Schmitt trigger S1. Diodes D3 and D4 and Schmitt trigger S1 can be formed in substrate 20 or externally by methods that are well known in the art.

Since the bottoms of wells 200–203 and 206–209 are adjacent the top surface of insulating silicon dioxide layer 32, each of these wells is isolated from other regions of silicon layer 33. Neither N-channel MOSFET N1 nor P-channel MOSFET P1 is formed in a well which is of opposite conductivity from the substrate, as with conventional CMOS devices. As a result, MOSFETs N1 and P1 are completely symmetrical.

Figure 4A:
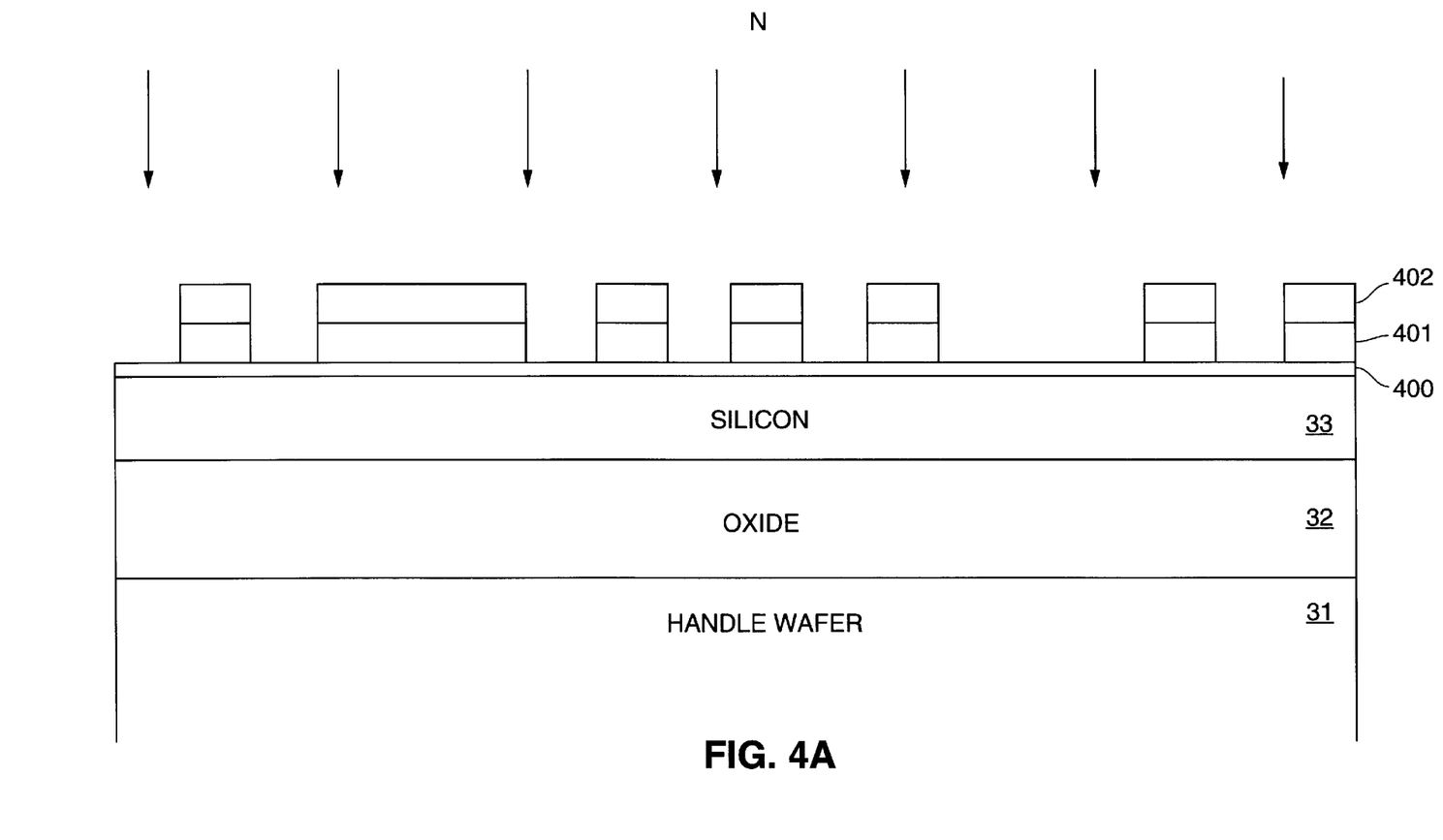
FIGS. 4A–4F illustrate steps of a process that may be used to fabricate the integrated circuit embodiment illustrated in FIGS. 2 and 3.
Figure 4B:
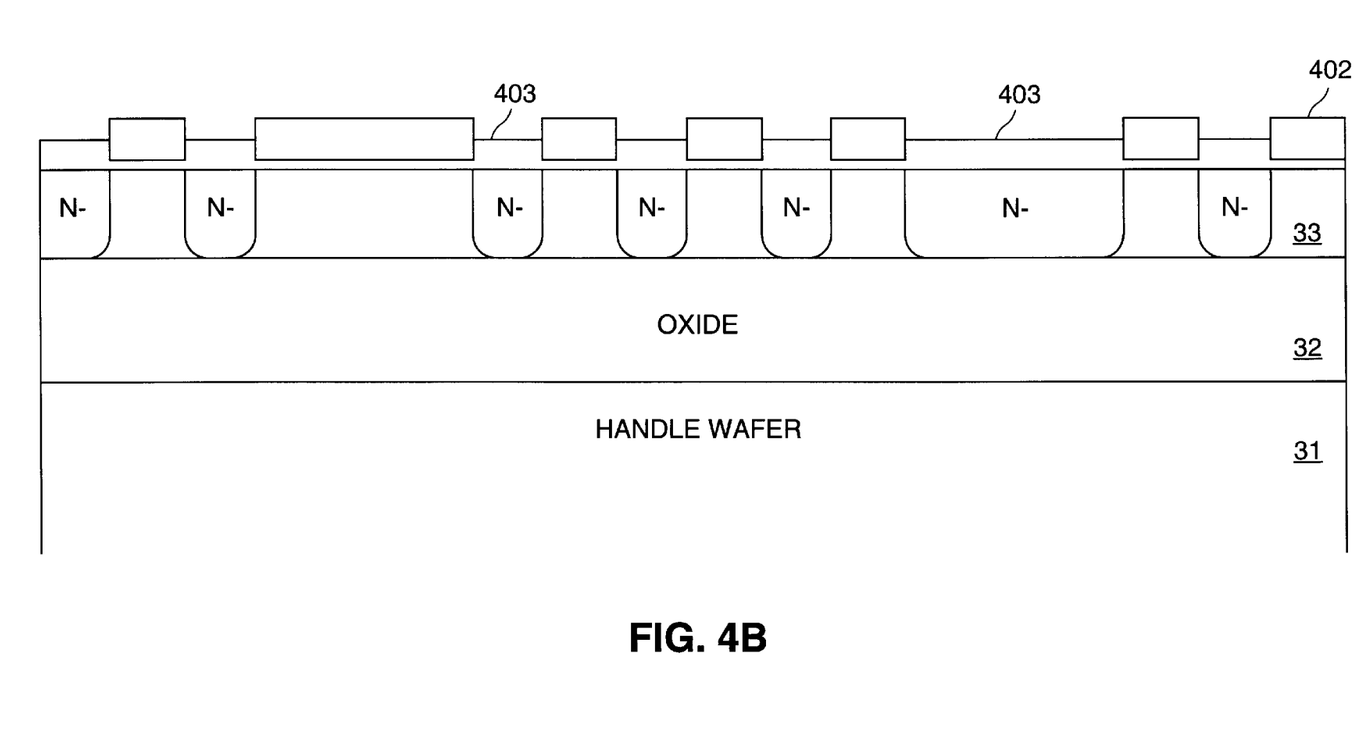

FIGS. 4A–4F illustrate a conventional CMOS process sequence that can be used to fabricate an interface circuit of the kind shown in FIGS. 2 and 3. The process begins with substrate 20, which as noted above includes handle wafer 31, silicon dioxide layer 32 and silicon layer 33. As shown in FIG. 4A, a pad oxide layer 400 is deposited to a thickness of about 450 Å, followed by a nitride layer 401 (1350 Å) and a resist layer 402. Pad oxide layer 400 and nitride layer 401 are patterned and etched and N-type dopant is implanted, preferably phosphorus. This produces the N-wells as shown in FIG. 4B. Resist layer 402 is then stripped, and a selective oxide layer 403 is grown to a thickness of about 5000 Å over the N-wells.

Figure 4C:
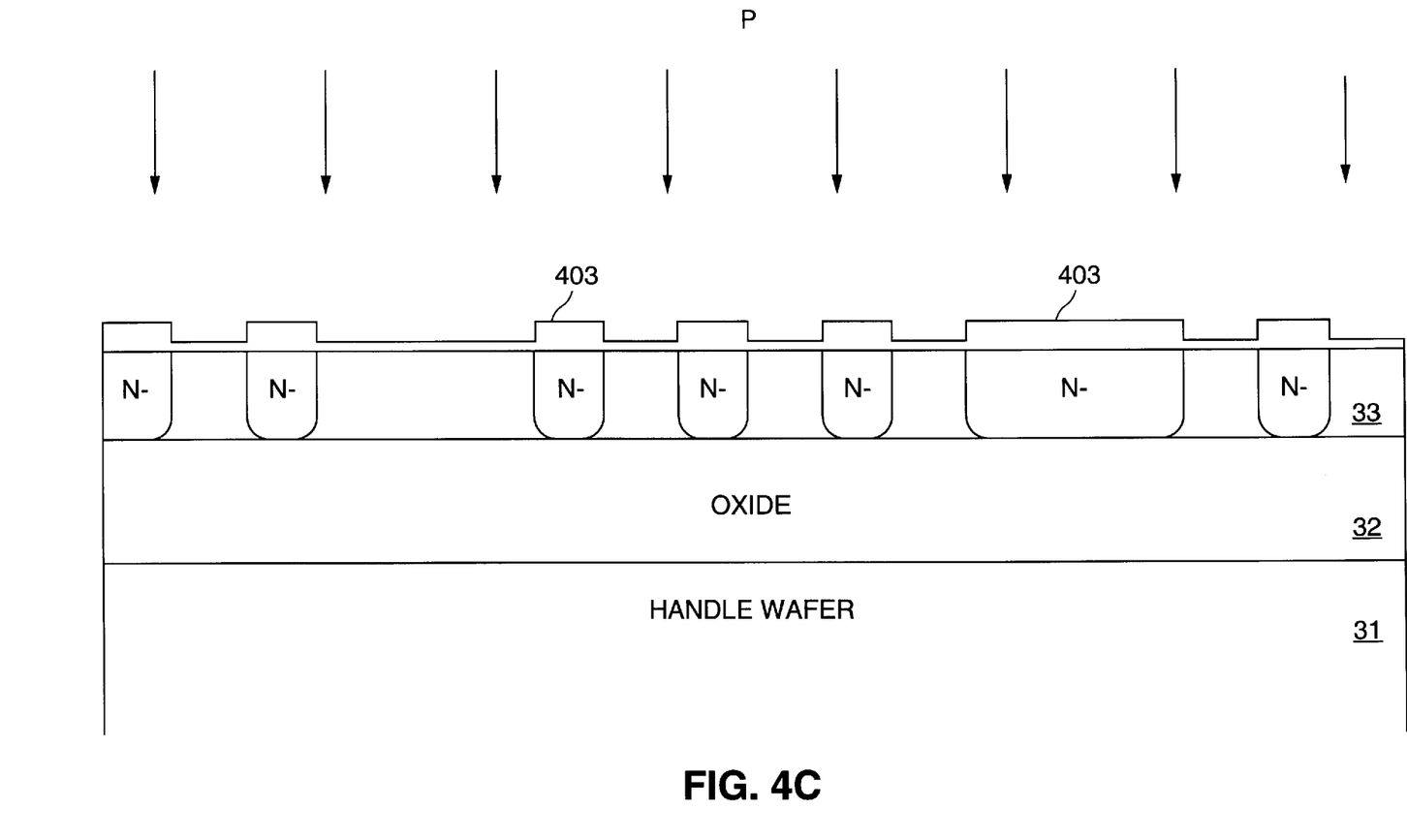
Figure 4D:
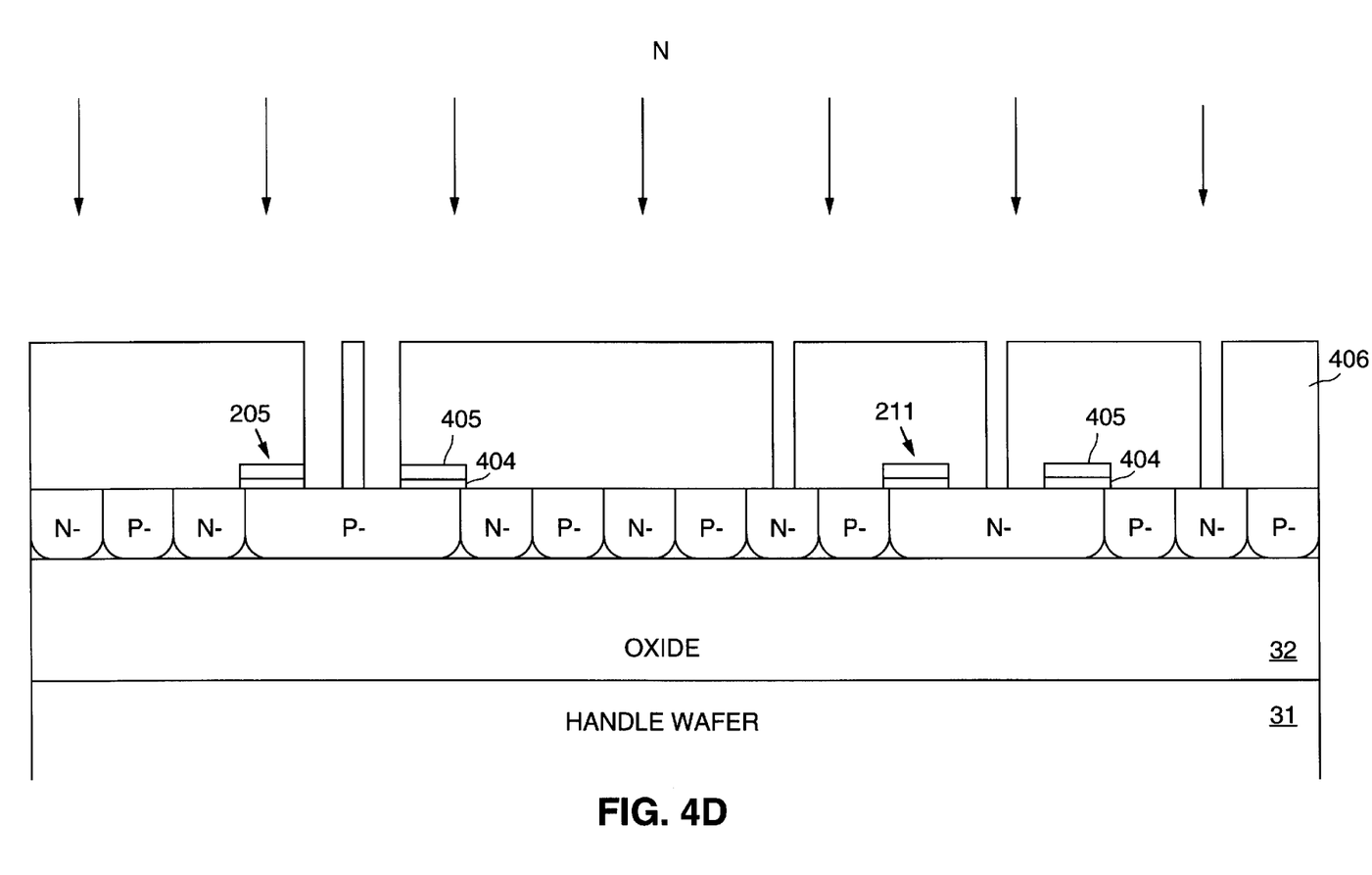

As shown in FIG. 4C, nitride layer is removed, and P-type dopant is implanted, preferably boron flouride. The resulting P-wells are shown in FIG. 4D.

Selective oxide layer 403 is then etched back, and the N- and P-wells are driven in at a temperature of 1100° for two hours. The remaining oxide is then stripped, and a gate oxide layer 404 is grown on the top surface of silicon layer 33. A polysilicon layer 405 is deposited on gate oxide layer 404 and doped with phosphorus. Polysilicon layer 405 and gate oxide layer 404 are then masked and etched, forming gates 205 and 211 as shown in FIG. 4D. An N+ blocking mask 406 is deposited and patterned, and N-type dopant is implanted at a concentration of about $2\times10^{12}$ cm$^{-2}$.

Figure 4E:
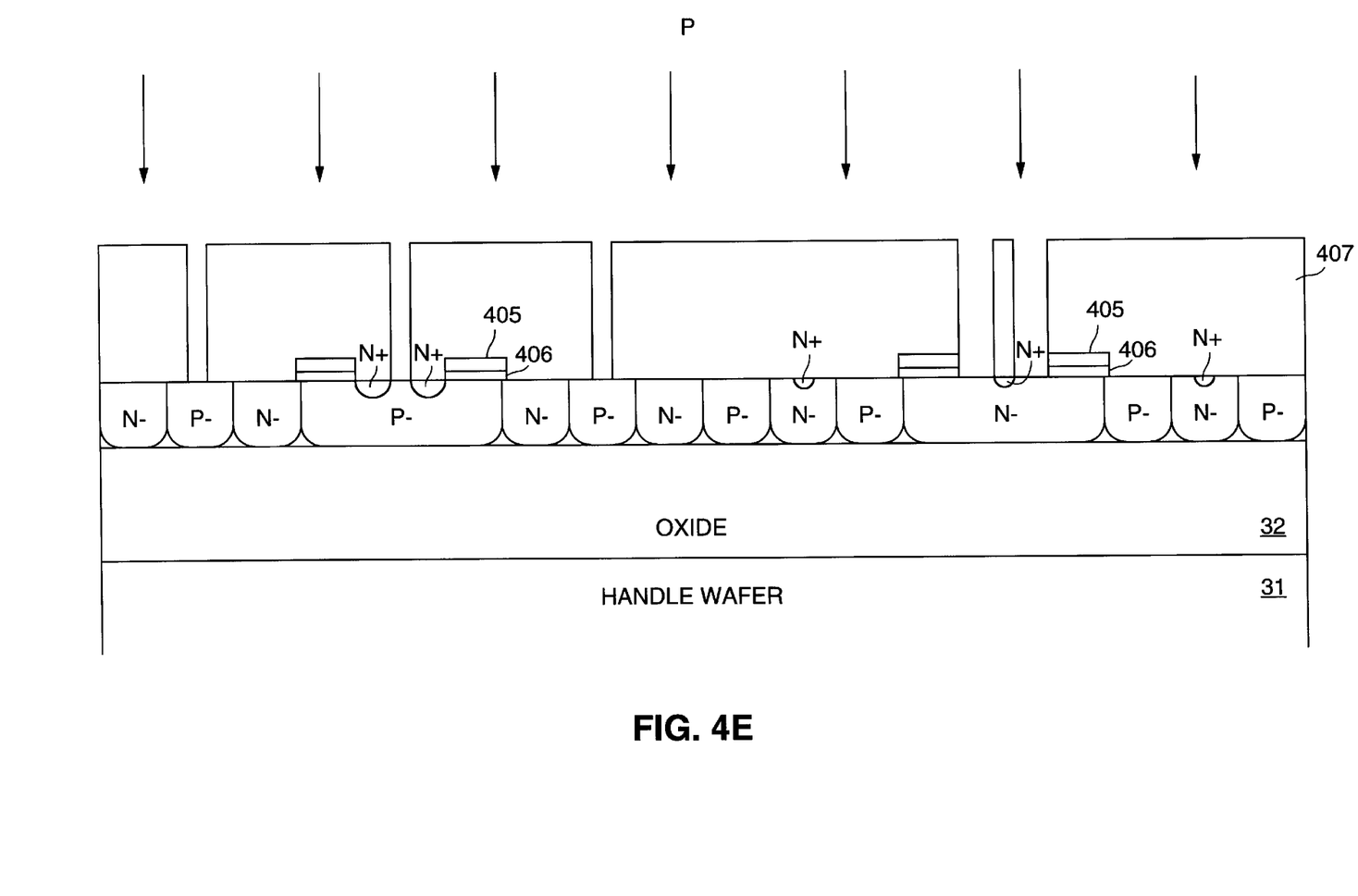
Figure 4F:
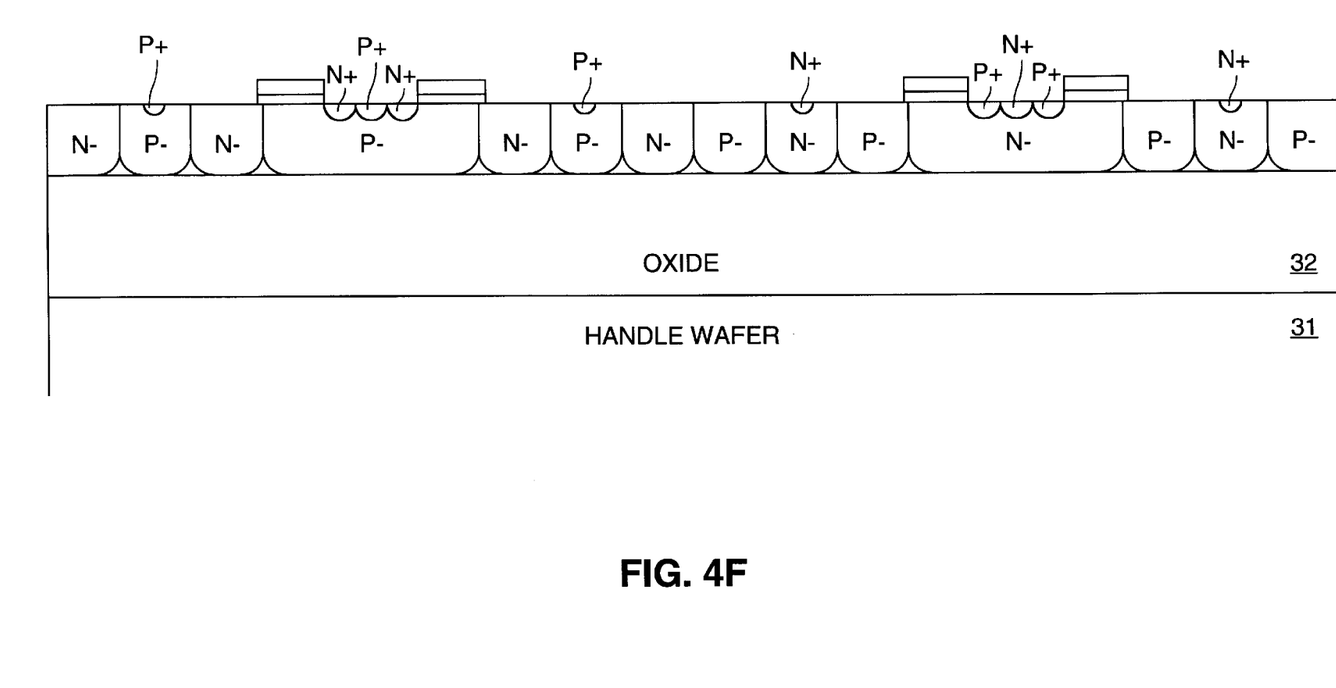

This forms the N+ regions shown in FIG. 4E. N+ blocking mask 406 is removed, and a P+ blocking mask 407 is laid down and patterned. P-type dopant is implanted at a concentration of about $2\times10^{12}$ cm$^{-2}$, yielding the structure shown in FIG. 4F.

It will be understood by those skilled in the art the known steps may be included in the process for such purposes as forming field oxide regions, providing lightly doped drains (e.g., using gate spacers), and adjusting the threshold voltage of the MOSFETs.

Following the formation of the doped regions within silicon layer 33, metal and insulating layers are deposited over the substrate to properly connect MOSFETs N1 and P1 and diodes D1 and D2 to diodes D3 and D4 and Schmitt trigger S1. Methods of making these connections and of fabricating diodes D1 and D2 and Schmitt trigger S1 in CMOS are well known in the art.

The embodiment described above is illustrative only and not limiting. It will be apparent to those skilled in the art that numerous alternative embodiments may be constructed in accordance with the broad principles of this invention.

I claim:

1. A CMOS device formed in a silicon-on-insulator (SOI) substrate, said CMOS device comprising:

an N-channel MOSFET comprising a first N well, a first P well and a relatively shallow N diffusion within said first P well, a portion of said first P well adjacent a surface of said SOI substrate forming a channel of said N-channel MOSFET, said first N well and said first P well extending to a surface of an insulating layer within said SOI substrate, a first gate being formed over said channel of said N-channel MOSFET, said first gate being connected to a first voltage;

a P-channel MOSFET comprising a second P well, a second N well and a relatively shallow P diffusion within said second N well, a portion of said second N well adjacent a surface of said SOI substrate forming a channel of said P-channel MOSFET, said second P well and said second N well extending to said surface of said insulating layer, a second gate being formed over said channel of said P-channel MOSFET, said second gate being connected to a second voltage;

a third P well formed in said SOI substrate adjacent said first N well, a junction between said first N well and said third P well forming a first diode; and a third N well formed in maid SOI substrate adjacent said second P well, a junction between said second P well and said third N well forming a second diode.

2. The CMOS device of claim 1 wherein said first and second diodes are coupled to an input signal.

3. A CMOS device formed in a silicon-on-insulator (SOI) substrate, said CMOS device comprising:

an N-channel MOSFET comprising a first N well, A first P well and a relatively shallow N diffusion within said first P well, a portion of said first P well adjacent a surface of said SOI substrate forming a channel of said N-channel MOSFET, said first N well and said first P well extending to a surface of an insulating layer within said SOI substrate, a first gate being formed over said channel of said N-channel MOSFET;

a P-channel MOSFET comprising a second P well, a second N well and a relatively shallow P diffusion within said second N well, a portion of said second N well adjacent a surface of said SOI substrate forming a channel of said P-channel MOSFET, said second P well and said second N well extending to said surface of said insulating layer, a second gate being formed over said channel of said P-channal MOSFET;

a third P well formed in said SOI substrate adjacent said first N well, a junction between said first N well and said third P well forming a first diode; and a third N well formed in said SOI substrate adjacent said second P well, a junction between said second P well and said third N well forming a second diode, wherein said first P well and said second N well are connected to an input of a Schmitt trigger.

4. The CMOS device of claim 3 wherein said first P well is shorted to said relatively shallow N diffusion, and said second N well is shorted to said relatively shallow P diffusion.

5. The CMOS device of claim 3 further comprising a third diode connected between said input of said Schmitt trigger and a first voltage, and a fourth diode connected between said input of said Schmitt trigger and a second voltage.

6. A method of fabricating a CMOS interface circuit, said method comprising:

providing a silicon-on-insulator substrate, said substrate comprising a silicon layer;

introducing N-type dopant into said silicon layer so as to form first and second N-wells;

introducing P-type dopant into said silicon layer so as to form first and second P-wells adjacent said first and second N-wells, respectively;

introducing P-type dopant into said silicon layer so as to form a third P-well adjacent said first N-well, a junction between said first N-well and said third P-well forming a first diode;

introducing N-type dopant into said silicon layer so as to form a third N-well adjacent said second P-well, a junction between said second P-well and said third N-well forming a second diode;

introducing N-type dopant into said silicon layer so as to form a relatively shallow N diffusion within said first P-well;

introducing P-type dopant into said silicon layer so as to form a relatively shallow P diffusion within said second N-well;

forming a first gate over a channel region within said first P-well and forming a second gate over a channel region within said second N-well; and connecting said first P-well and said second N-well to an input of a Schmitt trigger, wherein said first and second N-wells and said first and second P-wells extend to an interface between said silicon layer and an insulating layer of said substrate.

7. The method of claim 6 further comprising connecting said third P-well and said third N-well to an input signal.

* * * * *